United States Patent [19]
Muramatsu et al.

[11] Patent Number: 6,110,755
[45] Date of Patent: Aug. 29, 2000

[54] METHOD FOR MANUFACTURING SEMICONDUCTOR DEVICE

[75] Inventors: Shigetsugu Muramatsu; Hiroshi Miyagawa, both of Nagano, Japan

[73] Assignee: Shinko Electric Industries Co., Ltd., Nagano, Japan

[21] Appl. No.: 09/194,733

[22] PCT Filed: Apr. 3, 1998

[86] PCT No.: PCT/JP98/01546

§ 371 Date: Dec. 2, 1998

§ 102(e) Date: Dec. 2, 1998

[87] PCT Pub. No.: WO98/44547

PCT Pub. Date: Oct. 8, 1998

[30] Foreign Application Priority Data

Apr. 3, 1997 [JP] Japan ................................... 9-084907

[51] Int. Cl.$^7$ .................................................. H01L 21/00
[52] U.S. Cl. .............................. 438/26; 438/22; 438/106; 438/127
[58] Field of Search ................................. 438/26, 22, 106, 438/127

[56] References Cited

U.S. PATENT DOCUMENTS 5,614,443  3/1997  Nakashima et al. .
5,684,327  11/1997  Nakazawa et al. .

FOREIGN PATENT DOCUMENTS 4-276414  10/1992  Japan .
9-36151  2/1997  Japan .

*Primary Examiner*—Kevin M. Picardat
*Assistant Examiner*—D. M. Collins
*Attorney, Agent, or Firm*—Pennie & Edmonds LLP

[57] ABSTRACT

A method for producing semiconductor devices by mounting semiconductor chips 12 on a substrate 20 and resin-encapsulated the same is provided, wherein a plurality of semiconductor devices having a high reliability are simultaneously and efficiently obtained from a single large-sized substrate, comprising the steps of mounting a plurality of semiconductor chips 12 on the large-sized substrate 20 in correspondence to a plurality of unit substrates 20*a* formed thereon; resin-encapsulating the semiconductor chips 12 by filling a encapsulating resin 16 in the inside of the outer peripheral edge of the large-sized substrate 20; and cutting the large-sized substrate 20 thus resin-encapsulated together with the encapsulating resin 16 into individual unit substrates to obtain a plurality of resin-encapsulated semiconductor devices.

6 Claims, 3 Drawing Sheets

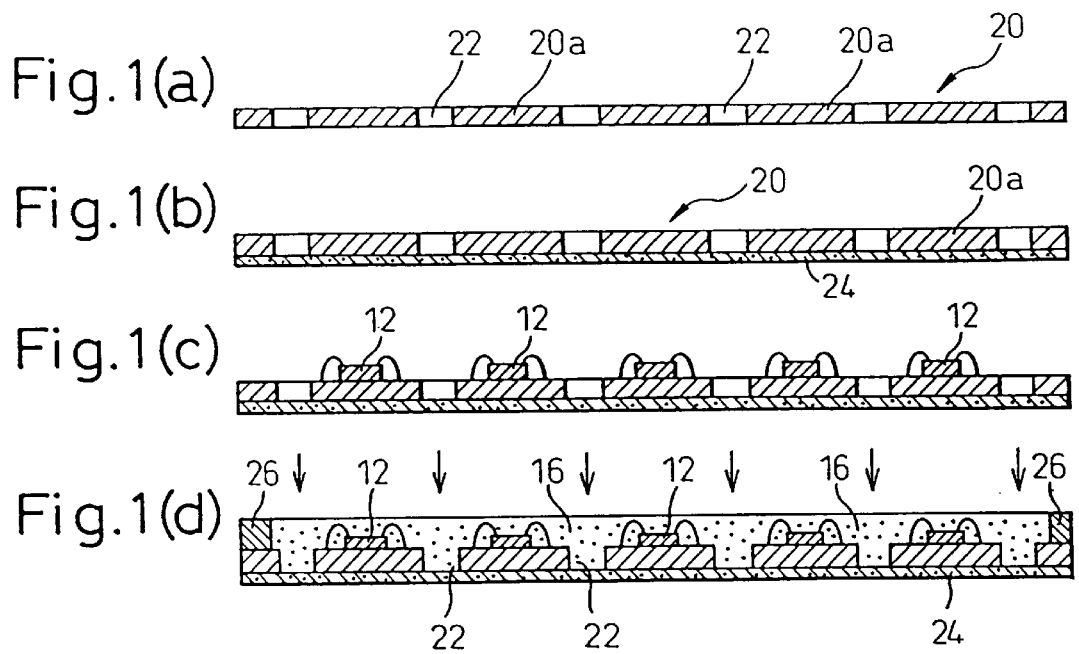
Fig.1(a)
Fig.1(b)
Fig.1(c)
Fig.1(d)
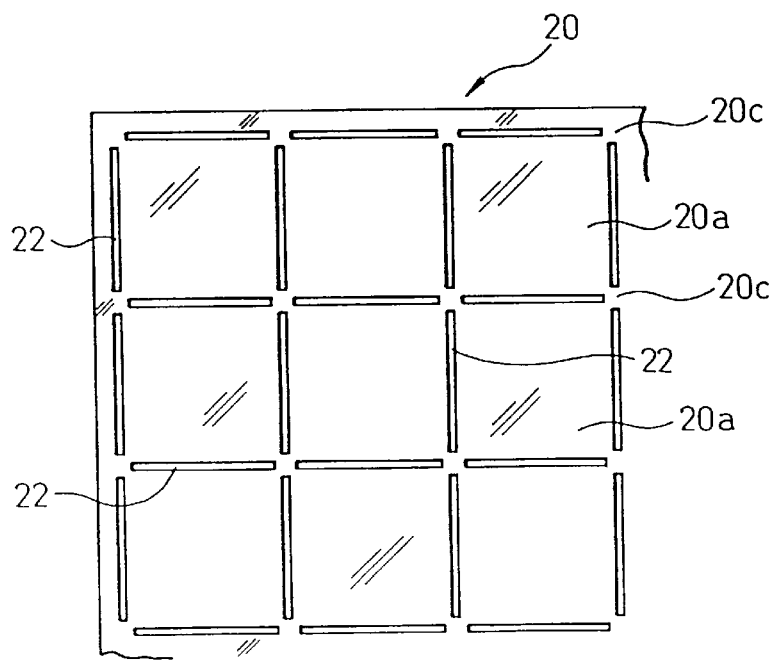
Fig. 2

METHOD FOR MANUFACTURING SEMICONDUCTOR DEVICE

TECHNICAL FIELD

The present invention relates to a method for producing semiconductor devices, and particularly to a method for efficiently producing reliable semiconductor devices, using a large-sized circuit board from which a plurality of individual boards can be obtained.

BACKGROUND ART

A resin encapsulated semiconductor device, for example, of a BGA (Ball Grid Array) type using a resinous substrate of a printed circuit board or others, is provided while encapsulating a semiconductor chip with a resin through a potting method or by using a resin-encapsulating mold. The potting method is advantageous because of its ease of execution and its application to a large-sized-resinous substrate used for simultaneously forming a plurality of individual circuit boards. On the other hand, the method using the resin-encapsulating mold is advantageous because it has a shorter cycle time to facilitate productivity.

In the prior art, encapsulating is carried out by the potting method after a semiconductor chip 12 has been die-bonded to a substrate 10, and electrically connected to a circuit pattern by wire-bonding or the like, wherein a dam 14 is formed with a resin having a shape-retention property around the periphery or an area to be encapsulated and a encapsulating resin 16 is injected into the interior of the dam 14. In such a manner, according to the prior art method for producing a semiconductor device while encapsulating the same by the potting method, it is necessary to form the dam 14 around the area to be encapsulated, which results in a problem in that a package size becomes larger by the dam space. Also, when a large-sized resinous substrate is used, from which a plurality of individual boards are to be obtained, the dam 14 must be formed in the respective packages, whereby fewer packages are obtainable from this resinous substrate.

When the individual semiconductor device is obtained by mounting semiconductor chips on a large-sized substrate, resin-encapsulating the same and separating the respective packages from large-sized substrate, the lateral surface of the separated substrate 10 is exposed outside as shown in FIG. 8, from which the moisture is liable to be absorbed to lower the reliability of the package, especially if the substrate is made of resin.

DISCLOSURE OF THE INVENTION

An object of a method for producing a semiconductor device according to the present invention relates to a method for obtaining products by encapsulating one surface of a substrate mounting semiconductor chips thereon, such as a BGA type, capable of minimizing a package size and increasing the number of products obtained from a large-sized substrate as well as resulting in a reliable semiconductor device.

To achieve the above-mentioned object, the present invention has the following constituent features:

That is, according to the present invention, a method for producing semiconductor devices, each comprising a semiconductor chip mounted on a substrate and encapsulated with resin, is provided, said method comprising the steps of: mounting a semiconductor chip on each of the unit substrates formed in a large-sized substrate to be sectioned by slits arranged along a contour of the unit substrate while leaving a connecting area between the adjacent unit substrates; laminating a tape for preventing the encapsulating resin from flowing out from the slits on a surface of the large-sized substrate opposite to that mounting the semiconductor chips thereon; resin-encapsulating the semiconductor chip by filling a encapsulating resin into an area of the surface mounting the semiconductor chip thereon defined inside of the outer periphery of the large-sized substrate; and cutting the large-sized substrate thus resin-encapsulated into individual unit substrates together with the encapsulating resin to obtain individual resin-encapsulated semiconductor devices.

The step of resin-encapsulating the semiconductor chip may be carried out by providing a dam for inhibiting the flow-out of the encapsulating resin on the outer periphery of the large-sized substrate.

The step of resin-encapsulating the semiconductor chip may be carried out while clamping the outer periphery of the large-sized substrate by a resin-encapsulating mold and filling the encapsulating resin into a cavity of the resin-encapsulating mold.

Also, a method for producing semiconductor devices, each comprising a semiconductor chip mounted on a substrate and encapsulated with resin is provided, said method comprising the steps of: mounting a semiconductor chip on each of the unit substrates formed in a large-sized substrate to be sectioned by slits arranged along a contour of the unit substrate while remaining a connecting area between the adjacent unit substrates; resin-encapsulating the semiconductor chips mounted on the surface of the large-sized substrate by clamping the outer periphery of the large-sized substrate by a resin-encapsulating mold, bringing a surface of the large-sized substrate opposite to the surface mounting the semiconductor chips thereon into contact with the resin-encapsulating mold and filling a encapsulating resin into a cavity of the resin-encapsulating mold; and cutting the large-sized substrate thus resin-encapsulated into individual unit substrates together with the encapsulating resin to obtain a plurality of resin-encapsulated semiconductor devices.

The large-sized substrate may be a resinous substrate.

BRIEF DESCRIPTION OF THE DRAWINGS

FIGS. 1(a) to 1(d) illustrate one embodiment of a method for producing semiconductor devices according to the present invention;

FIGS. 2, 3 and 4 are plan views of various large-sized substrate, respectively, used in the present invention for producing semiconductor devices;

BEST MODE FOR CARRYING OUT THE INVENTION

Figure 3:
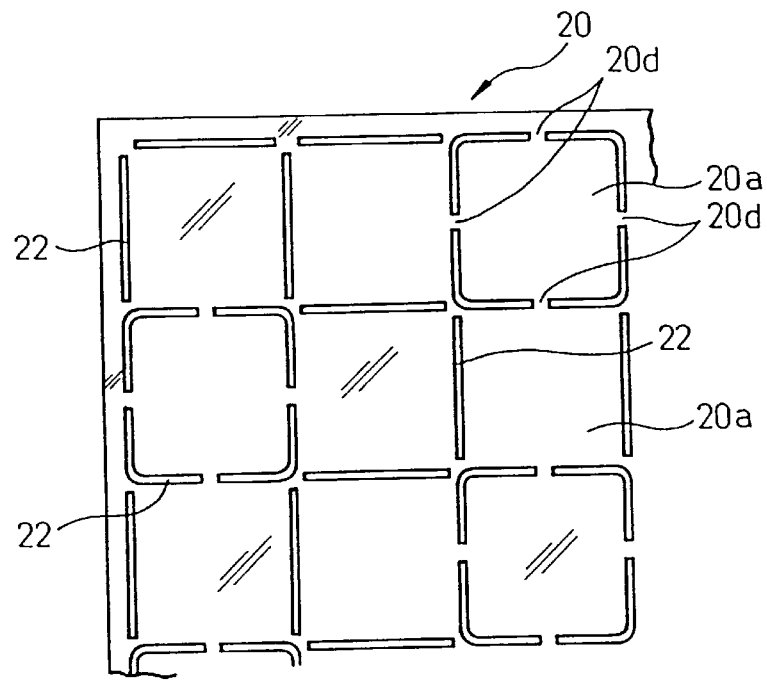

The present invention will be described below in more detail with reference to the preferred embodiments illustrated in the attached drawings.

FIGS. 1(a) to 1(d) illustrate a process for producing a BGA according to a potting method. Reference numeral 20 denotes a large-sized resinous substrate used for simultaneously producing a plurality of semiconductor devices. This resinous substrate 20 may be of a glass fiber-reinforced resin containing a glass fiber cloth. As shown in FIG. 1(a), slits 22 are provided at positions corresponding to contours of a semiconductor device when the resinous substrate 20 is divided into individual semiconductor devices. A width of the slit 22 is determined while taking account of a thickness of a mold for forming the slit, a thickness t (see FIG. 5) of a encapsulating resin formed on the out side surface of a unit substrate 20a described later or others.

Figure 4:
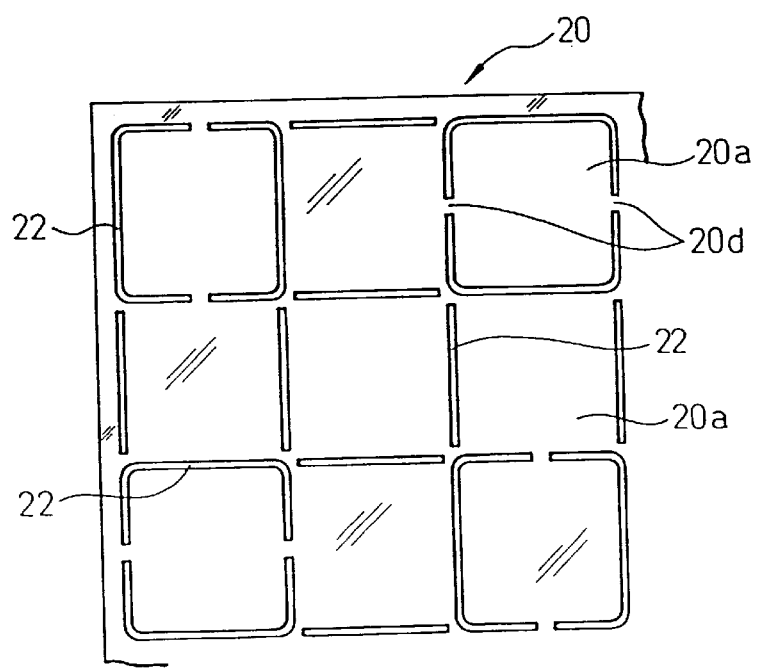

FIG. 2 illustrates a plan view of the resinous substrate 20. The slits 22 are provided at positions corresponding to boundaries between every adjacent unit substrate 20a to be separated from each other, substantially along the length thereof. Thereby, the adjacent unit substrates 20a are connected to each other only by corner sections 20c. The slits 22 are not limited to this type but may be of other types shown, for example, in FIGS. 3 and 4 wherein a rib 20d is provided in a mid portion of the slit 22 for the purpose of enhancing the rigidity of the resinous substrate 20. According to FIG. 3, the ribs are provided at four positions on the outer periphery, while according to FIG. 4, the ribs are provided at two positions on the outer periphery.

The resinous substrate 20 has die pads for die-bonding semiconductor chips through a predetermined process; circuit patterns for electrically connecting the semiconductor chips to external connection terminals; and lands for bonding the external connection terminals. In the drawings, the circuit patterns or others are eliminated.

Then, a tape 24 is adhered to a lower surface of the resinous substrate 20; i.e., a surface opposite to that mounting the semiconductor chips. The tape 24 operates to prevent a potting resin 16 from flowing out through the slits 22 when the potting resin is supplied onto the large-sized resinous substrate 20. The tape 24 may be of any type provided that it is readily removable after being adhered to the resinous substrate 20.

Next, a semiconductor chip 12 is mounted onto the respective unit substrate 20a of the resinous substrate 20 and electrically connected to a circuit pattern. The electrical connection of the semiconductor chip 12 is conducted by a wire-bonding method, a flip chip method or the like. FIG. 1(c) illustrates a state wherein the semiconductor chips 12 are mounted to the resinous substrate 20 by wire-bonding. In this regard, a process for adhering the tape 24 may be conducted either before or after the mounting of semiconductor chips 12, provided that it is carried out prior to supplying the encapsulating resin 16 to the resinous substrate 20.

Then, a dam 26 is made of a resin, having a predetermined shape-retention property, along the peripheral edge of the resinous substrate 20, for the purpose of preventing the encapsulating resin from flowing out. FIG. 1(d) illustrates a state wherein the encapsulating resin 16 is filled in an area encircled by the dam 26 on the surface of the resinous substrate. As illustrated, the encapsulating resin 16 flows into the slits 22 having a depth corresponding to a thickness of the resinous substrate. While the encapsulating resin 16 is supplied, the resinous substrate 20 is maintained in a horizontal position so that the encapsulating resin 16 is filled at a uniform thickness all over the interior of the dam 26.

A purpose of providing the dam 26 is to supply the encapsulating resin 16 onto the resin-encapsulating surface at a predetermined thickness. Instead of using the dam 26, the outer periphery of the resinous substrate 20 may be clamped by a jig prior to the potting.

After the potting resin 16 has been cured, the tape 24 is released from the lower surface of the resinous substrate 20, and the resinous substrate 20 is cut in the longitudinal and transverse directions together with the encapsulating resin 16 at positions corresponding to the slits 22 formed on the large-sized resinous substrate 20, into individual semiconductor devices 30. Arrows in FIG. 1(d) show positions on the resinous substrate 20 to be cut.

Figure 5:
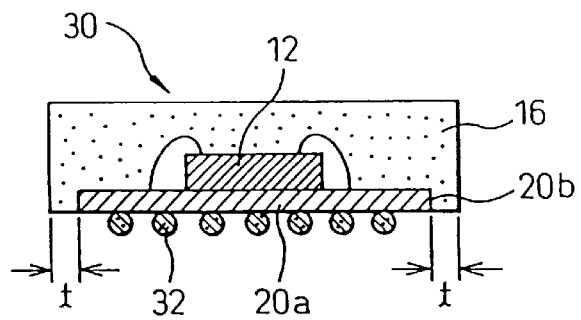
FIG. 5 is a sectional view of a semiconductor device obtained by a method according to the present invention.

FIG. 5 illustrates a semiconductor device 30 thus obtained. That is, the semiconductor device 30 has a structure in that the semiconductor chip 12 is mounted on the unit substrate 20a, a surface of the unit substrate 20a for mounting the semiconductor chip 12 thereon is encapsulated with the encapsulating resin 16, and a lateral surface of the unit substrate 20a is also encapsulated with the encapsulating resin 16 because the slit 22 is cut along a center line thereof.

After being cut into the unit substrates 20a, solder balls 32 are mounted on terminal portions of each of the unit substrates 20a, whereby semiconductor chips 30 are obtained as BGA packages. The bonding of the solder balls 32 may be carried out before the semiconductor chips 12 are mounted on the individual unit substrate 20a of the substrate 20.

Since the semiconductor device 30 is encapsulated solely with the encapsulating resin 16 without providing individually the potting dam on the substrate, the substrate has a minimum size as a package, whereby the miniaturization of the package is enhanced. Also, since the outer lateral surface 20b of the substrate is encapsulated with the encapsulating resin 16 and is not exposed outside, it is possible to prevent moisture from preventing the package through the outer lateral surface 20b which is the portion of the substrate which most easily absorbs moisture, and to improve the reliability of the package.

According to this aspect of the method for producing semiconductor devices, since the dam 26 is not formed in the individual substrate 20a provided on the resinous substrate 20 but is solely formed along the outer peripheral edge of the resinous substrate 20 for the purpose of resin, it is sufficient that the resinous substrate 20 has the minimum area required as a substrate for forming the semiconductor devices, whereby the number of products to be obtained from the large-sized resinous substrate 20 substantially becomes the maximum, resulting in effective production.

According to this embodiment of the method for producing semiconductor devices, since the large-sized resinous substrate 20 is cut into individual substrates after the mounting of semiconductor chips 12, the lamination of tape 24 and the encapsulating of resin have been carried out on the large-sized resinous substrate 20 itself, it is unnecessary to handle the individual substrates whereby the operability thereof is extremely facilitated.

Also, according to the prior art wherein the dam is formed in the individual substrate, the amount of resin for forming the dam or for resin-encapsulating by the potting must be strictly adjusted because the amount of resin is relatively small. On the contrary, according to the present invention wherein the large-sized resinous substrate 20 is used, the amount of resin is larger either when the dam 26 is formed or when the resin is filled in the dam 26. Therefore, there is an advantage in that the control of resin amount becomes relatively easy and that the position at which the dam 26 is formed need not be so strictly controlled.

Figure 6:
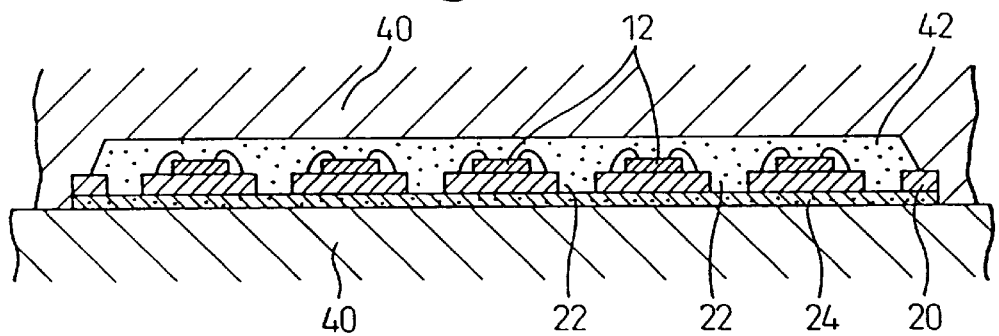
FIG. 6 illustrates another embodiment of a method for producing semiconductor devices according to the present invention wherein a tape and a mold are used.

While the semiconductor chip 12 is resin-encapsulated by a potting method in the above-mentioned embodiment, the semiconductor devices may be produced by resin-encapsulating the semiconductor chips by using a resin-encapsulating mold as shown in FIG. 6. In the embodiment shown in FIG. 6, semiconductor chips 12 are mounted to the respective unit substrates 20a of the large-sized resinous substrate 20 which is then clamped along the outer peripheral edge thereof with a resin-encapsulating mold 40 to form a cavity into which a encapsulating resin 42 is filled.

Also in this embodiment, after the resin-encapsulating, the large-sized resinous substrate 20 is cut into individual pieces together with encapsulating resin 42 at positions corresponding to the slits 22 to result in semiconductor devices. The resultant semiconductor device is encapsulated with the encapsulating resin 42 on the outer lateral surfaces of the unit substrate in the same manner as in the semiconductor device shown in FIG. 5. Thereafter, solder balls are mounted to the terminals to result in BGA package. The solder balls may be mounted to the large-sized resinous substrate before the same is divided into individual pieces.

Figure 7:
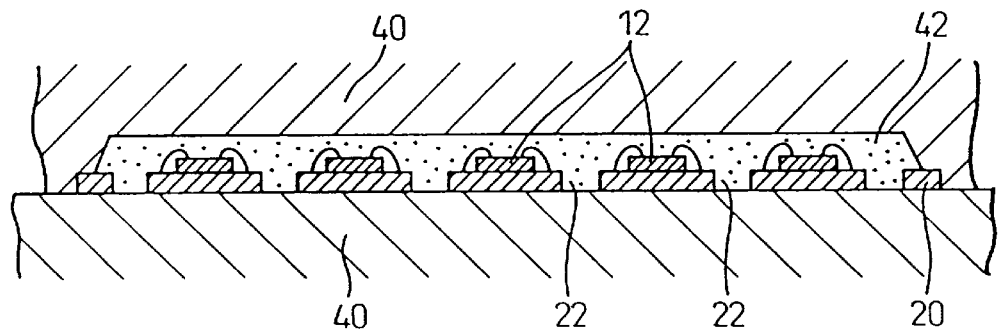
FIG. 7 illustrates a further aspect of a method for producing semiconductor devices according to the present invention wherein no tape is used but a mold is solely used.
Figure 8:
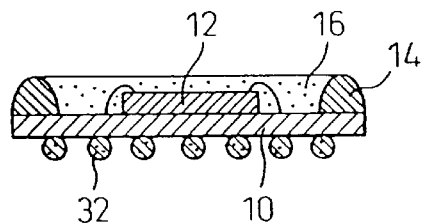
FIG. 8 is a sectional view of a semiconductor device obtained by a prior art production method.

In this regard, while the tape 24 is adhered to the lower surface of the resinous substrate 20, according to the embodiment shown in FIG. 6, so that the encapsulating resin is prevented from flowing to the lower surface of the resinous substrate 20 when the cavity is filled with the resin, it is also possible to prevent the flowing-out of the resin, without using the tape 24, by using the mold 40 as shown in FIG. 7.

In the above-mentioned embodiments, the large-sized resinous substrate 20 is used, wherein the slits 22 are provided in accordance with the configuration of a unit substrate of the individual product. However, it is also possible to use a resinous substrate 20 wherein unit substrates 20a are merely coupled to each other without interposing the slits 22. In such a case, after semiconductor chips 12 have been mounted onto every unit substrates 20a in the resinous substrate 20 and wire-bonded thereto, they are resin-encapsulated with a resin by a potting or using a resin-encapsulating mold in the same manner as in the above-mentioned embodiments, and the resinous substrate 20 is cut into individual unit substrates 20a together with the encapsulating resin in accordance with the arrangement of the unit substrates 20a.

As stated above, when the large-sized resinous substrate 20 having no slits 22 is used, the number of individual products obtained therefrom becomes a maximum. If the potting method or the resin-encapsulating method is employed as described above, it is possible to efficiently produce the products.

The generation of warpage is inevitable when a large-sized resinous substrate is used. Even if the warpage is generated in the resinous substrate, the tape can be adhered thereto in conformity with such warpage. Thereby, if the tape is stuck on the lower surface of the large-sized resinous substrate in close contact therewith, it is possible to prevent the encapsulating resin from flowing out therefrom. Contrarily, if the mold is solely used for preventing the encapsulating resin from flowing out from the lower surface of the large-sized resinous substrate, it is impossible to completely bring the mold into close contact with the lower surface of the mold because the mold does not have as much flexibility as the tape. Therefore, it is preferable to adhere the tape on the lower surface of the large-sized resinous substrate rather than solely using the mold, on the view point of preventing the flowing-out of the resin.

A large-sized substrate used for the production of semiconductor device is not limited to that made of resin as described in the above embodiments, but may be a resinous substrate containing a metal core, a metallic substrate or a ceramic substrate, and the present invention is also applicable to the production of semiconductor devices using such substrates.

Capability of Exploitation in Industry

According to a method for producing semiconductor devices of the present invention, it is possible, as described above, to increase the number of semiconductor devices obtained from a single large-sized substrate and to improve the productivity because the production steps can be carried out on this single large-sized substrate. Also, since there is no need for providing any portions on the substrate other than those composing the products, the resultant package becomes compact. By using a large-sized substrate having slits therein, it is possible to shield the outer lateral surfaces of the unit substrate and result in a reliable product. Further, by providing the slits, the large-sized substrate is easily cut into individual unit substrates.

Explanation of Reference Numerals 10 substrate
12 semiconductor chip
20 resinous substrate
20a unit substrate
20b outer peripheral edge
20c corner
20d reinforcement rib
22 slit
24 tape
26 dam
30 semiconductor device
40 resin-encapsulating mold
42 encapsulating resin

What is claimed is:

1. A method for producing semiconductor devices, each comprising a semiconductor chip mounted on a substrate and encapsulated with resin, said method comprising the steps of:

mounting a semiconductor chip on each of the unit substrates formed in a large-sized substrate to be sectioned by slits arranged along a contour of the unit substrate while leaving a connecting area between the adjacent unit substrates;

laminating a tape for preventing the encapsulating resin from flowing out from the slits on a surface of the large-sized substrate opposite to that mounting the semiconductor chips thereon;

resin-encapsulating the semiconductor chip by filling an encapsulating resin into an area of the surface mounting the semiconductor chip thereon defined inside of the outer periphery of the large-sized substrate so that said slits are also filled with the encapsulating resin; and cutting the large-sized substrate thus resin-encapsulated into individual unit substrates together with the encapsulating resin to obtain individual resin-encapsulated semiconductor devices wherein side surfaces of the individual unit substrate are covered with said encapsulating resin which had filled said slits.

2. A method for producing semiconductor devices as defined by claim 1, wherein the step of resin-encapsulating the semiconductor chip is carried out by providing a stopper for inhibiting the flow-out of the encapsulating resin on the outer periphery of the large-sized substrate; and filling the encapsulating resin in the inside of the dam.

3. A method for producing semiconductor devices as defined by claim 1, wherein the step of resin-encapsulating the semiconductor chip is carried out while clamping the outer periphery of the large-sized substrate by a resin-encapsulating mold and filling the encapsulating resin into a cavity of the resin-encapsulating mold.

4. A method for producing semiconductor devices as defined by claim 1, wherein as the large-sized substrate, a resinous substrate is used.

5. A method for producing semiconductor devices, each comprising a semiconductor chip mounted on a substrate and encapsulated with resin, said method comprising the steps of:

mounting a semiconductor chip on each of unit substrates formed in a large-sized substrate to be sectioned by slits arranged along a contour of the unit substrate while leaving a connecting area between the adjacent unit substrates;

resin-encapsulating the semiconductor chips mounted on a surface of the large-sized substrate by clamping the outer periphery of the large-sized substrate with a resin-encapsulating mold, bringing a surface of the large-sized substrate opposite to the surface mounting the semiconductor chips thereon into contact with the resin-encapsulating mold and filling an encapsulating resin into a cavity of the resin-encapsulating mold so that said slits are also filled with the encapsulating resin; and cutting the large-sized substrate thus resin-encapsulated into individual unit substrates together with the encapsulating resin to obtain individual resin-encapsulated semiconductor devices wherein side surfaces of the individual unit substrates are covered with said encapsulating resin which had filled said slits.

6. A method for producing semiconductor devices as defined by claim 5, wherein the large-sized substrate is a resinous substrate.

* * * * *